US 10,325,838 B2

(12) United States Patent
Mohamed et al.

(10) Patent No.: US 10,325,838 B2
(45) Date of Patent: Jun. 18, 2019

(54) SEMICONDUCTOR DEVICE FABRICATED BY FLUX-FREE SOLDERING

(71) Applicant: Infineon Technologies AG, Neubiberg (DE)

(72) Inventors: Abdul Rahman Mohamed, Johor (MY); Chu Hua Goh, Malacca (MY)

(73) Assignee: Infineon Technologies AG, Neubiberg (DE)

( * ) Notice: Subject to any disclaimer, the term of this patent is extended or adjusted under 35 U.S.C. 154(b) by 9 days.

(21) Appl. No.: 15/624,026

(22) Filed: Jun. 15, 2017

(65) Prior Publication Data

US 2017/0365544 A1 Dec. 21, 2017

(30) Foreign Application Priority Data

Jun. 17, 2016 (DE) .................. 10 2016 111 141

(51) Int. Cl.
*H01L 23/00* (2006.01)
*H01L 23/495* (2006.01)

(52) U.S. Cl.
CPC .. *H01L 23/49575* (2013.01); *H01L 23/49517* (2013.01); *H01L 23/49524* (2013.01); *H01L 24/83* (2013.01); *H01L 2224/83805* (2013.01); *H01L 2924/014* (2013.01)

(58) Field of Classification Search
CPC .............. H01L 23/49575; H01L 24/83; H01L 23/49517; H01L 2924/014; H01L 2224/83805
See application file for complete search history.

(56) References Cited

U.S. PATENT DOCUMENTS

| | | | | |
|---|---|---|---|---|
| 4,700,879 A | * | 10/1987 | Weidenauer | .......... H01L 23/492 228/123.1 |
| 4,935,803 A | | 6/1990 | Kalfus et al. | |
| 5,821,611 A | * | 10/1998 | Kubota | ............ H01L 23/49537 257/673 |
| 6,943,434 B2 | | 9/2005 | Tangpuz et al. | |
| 7,285,849 B2 | | 10/2007 | Cruz et al. | |
| 8,883,567 B2 | | 11/2014 | Wyant et al. | |
| 9,048,338 B2 | | 6/2015 | Hosseini | |

(Continued)

FOREIGN PATENT DOCUMENTS

DE 10 2012 110 494 5/2013

*Primary Examiner* — Ahmed N Sefer
(74) *Attorney, Agent, or Firm* — Dicke, Billig & Czaja, PLLC

(57) ABSTRACT

A method of fabricating a semiconductor device is disclosed. In one aspect, the method includes placing a first semiconductor chip on a carrier with the first main surface of the first semiconductor chip facing the carrier. A first layer of soft solder material is provided between the first main surface and the carrier. Heat is applied during placing so that a temperature at the first layer of soft solder material is equal to or higher than a melting temperature of the first layer of soft solder material. A second layer of soft solder material is provided between the first contact area and the second main surface. Heat is applied during placing so that a temperature at the second layer of soft solder material is equal to or higher than a melting temperature of the second layer of soft solder material. The first and second layers of soft solder material are cooled to solidify the soft solder materials.

18 Claims, 5 Drawing Sheets

(56) References Cited

U.S. PATENT DOCUMENTS

| | | | | |
|---|---|---|---|---|
| 2002/0014704 A1* | 2/2002 | Horie | ............... | H01L 23/3107 |
| | | | | 257/779 |
| 2007/0200219 A1* | 8/2007 | Otremba | ........... | H01L 23/49513 |
| | | | | 257/692 |
| 2007/0266558 A1 | 11/2007 | Otremba | | |
| 2009/0174058 A1* | 7/2009 | Standing | ............... | H01L 21/50 |
| | | | | 257/690 |
| 2011/0198738 A1* | 8/2011 | Van De Water | ...... | H01L 21/561 |
| | | | | 257/666 |
| 2013/0200532 A1* | 8/2013 | Otremba | ........... | H01L 23/49524 |
| | | | | 257/779 |
| 2013/0256852 A1* | 10/2013 | Wyant | ............... | H01L 23/49562 |
| | | | | 257/670 |
| 2014/0273344 A1* | 9/2014 | Terrill | ............... | H01L 23/49575 |
| | | | | 438/107 |

* cited by examiner

SEMICONDUCTOR DEVICE FABRICATED BY FLUX-FREE SOLDERING

CROSS-REFERENCE TO RELATED APPLICATION

This Utility Patent Application claims priority to German Patent Application No. 10 2016 111 141.4, filed Jun. 17, 2016, which is incorporated herein by reference.

BACKGROUND

The present disclosure relates to a method for fabricating a semiconductor device and to a semiconductor device. The present disclosure relates in particular to a method for fabricating a semiconductor device, wherein elements are connected with each other by using a soft solder material, and to a semiconductor device comprising soft solder material layers.

Semiconductor device manufacturers are constantly striving to increase the performance of their products, while decreasing the costs of manufacture. One important factor in the manufacture of semiconductor devices is connection technology, i.e. the connecting of different elements with each other to build-up the semiconductor device. Electronic circuits or devices are very often fabricated on semiconductor wafers, which are then singulated to produce semiconductor chips. Subsequently, the semiconductor chips may be mounted on electrically conductive carriers, such as leadframes. Furthermore, contact elements like contact clips or wire bonds may be connected to the semiconductor chips or to parts of the leadframe. These contact elements may themselves form external contact elements or may be connected to external contact elements. In a later step an encapsulant may be applied to form a molded semiconductor device package, wherein the external contact elements extend through outer surfaces of the encapsulant body. Connection techniques providing connections of high reliability at low expenses are desirable.

SUMMARY

In accordance with a first aspect of the disclosure a method for fabricating a semiconductor device comprises placing a first semiconductor chip on a carrier with the first main surface of the first semiconductor chip facing the carrier, wherein a first layer of soft solder material is provided between the first main surface and the carrier and heat is applied during placing so that a temperature at the first layer of soft solder material is equal to or higher than a melting temperature of the first layer of soft solder material, placing a contact clip comprising a first contact area on the first semiconductor chip with the first contact area facing the second main surface of the first semiconductor chip, wherein a second layer of soft solder material is provided between the first contact area and the second main surface and heat is applied during placing so that a temperature at the second layer of soft solder material is equal to or higher than a melting temperature of the second layer of soft solder material, and thereafter cooling the first and second layers of soft solder material to solidify the soft solder materials.

In accordance with a second aspect of the disclosure a method for fabricating a semiconductor device comprises applying a first flux-free soft solder deposit to a carrier at a temperature equal to or greater than a melting temperature of the first flux-free soft solder deposit, placing a first semiconductor chip on the first flux-free soft solder deposit, applying a second flux-fee soft solder deposit to the first semiconductor chip at a temperature equal to or greater than a melting temperature of the second flux-free soft solder deposit, placing a contact clip on the second flux-free soft solder deposit, and thereafter cooling the first and second soft solder deposits to solidify the first and second soft solder deposits.

In accordance with a third aspect of the disclosure a semiconductor device comprises a carrier, a first semiconductor chip mounted on the carrier, a first soft solder bond layer between the carrier and the first semiconductor chip, a contact clip mounted on the first semiconductor chip, and a second soft solder bond layer between the first semiconductor chip and the contact clip.

The person skilled in the art recognizes additional features and advantages upon reading the following detailed description and upon giving consideration to the accompanying drawings.

BRIEF DESCRIPTION OF THE DRAWINGS

The accompanying drawings are included to provide a further understanding of examples and are incorporated in and constitute a part of this specification. The drawings illustrate examples and together with the description serve to explain principles of examples. Other examples and many of the intended advantages of examples will be readily appreciated as they become better understood by reference to the following detailed description.

The elements of the drawings are not necessarily to scale relative to each other. Like reference numerals designate corresponding similar parts.

DETAILED DESCRIPTION

Figure 1:
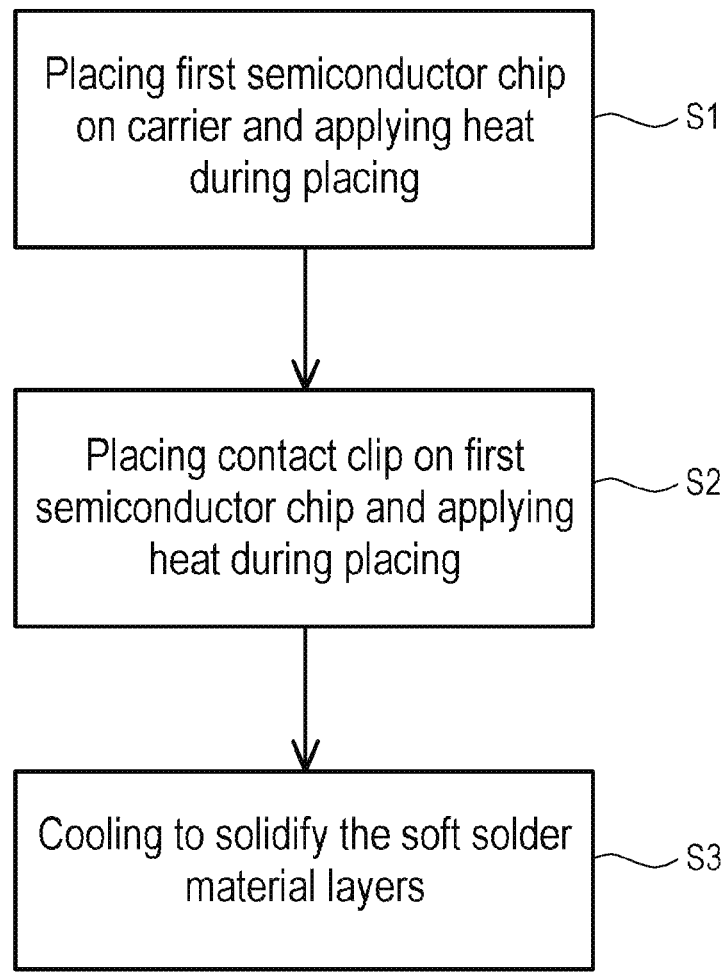
FIG. 1 shows a flow diagram for illustrating an exemplary method for fabricating a semiconductor device according to a first aspect.

The aspects and examples are now described with reference to the drawings, wherein like reference numerals are generally utilized to refer to like elements throughout. In the following description, for purposes of explanation, numerous specific details are set forth in order to provide a thorough understanding of one or more aspects of the examples. It may be evident, however, to one skilled in the art that one or more aspects of the examples may be practiced with a lesser degree of the specific details. In other instances, known structures and elements are shown in schematic form in order to facilitate describing one or more aspects of the examples. It is to be understood that other examples may be utilized and structural or logical changes may be made without departing from the scope of the present disclosure. It should be noted further that the drawings are not to scale or not necessarily to scale.

In the following detailed description, reference is made to the accompanying drawings, which form a part hereof, and in which is shown by way of illustration specific aspects in which the disclosure may be practiced. In this regard, directional terminology, such as "top", "bottom", "front", "back" etc., may be used with reference to the orientation of the figures being described. Since components of described devices may be positioned in a number of different orientations, the directional terminology may be used for purposes of illustration and is in no way limiting. It is understood that other aspects may be utilized and structural or logical changes may be made without departing from the scope of the present disclosure. The following detailed description, therefore, is not to be taken in a limiting sense, and the scope of the present disclosure is defined by the appended claims.

In addition, while a particular feature or aspect of an example may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives may be used. It should be understood that these terms may be used to indicate that two elements co-operate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present disclosure is defined by the appended claims.

The examples of a method for fabricating an electronic device, of an electronic device may use various types of semiconductor devices. The examples may use transistor devices embodied in semiconductor dies or semiconductor chips wherein the semiconductor dies or semiconductor chips may be provided in a form of a block of semiconducting material as fabricated from a semiconductor wafer and diced out from the semiconductor wafer, or in another form in which further process steps have been carried out like, for example, applying an encapsulation layer to the semiconductor die or semiconductor chip. The examples may also use horizontal or vertical transistor devices wherein those structures may be provided in a form in which all contact elements of the transistor device are provided on one of the main faces of the semiconductor die (horizontal transistor structures) or in a form in which at least one electrical contact element is arranged on a first main face of the semiconductor die and at least one other electrical contact element is arranged on a second main face opposite to the main face of the semiconductor die (vertical transistor structures) like, for example, MOS transistor structures or IGBT (Insulated Gate Bipolar Transistor) structures.

In any case the electronic devices, e.g. the semiconductor dies or semiconductor chips, may comprise contact elements or contact pads on one or more of their outer surfaces wherein the contact elements are electrically connected with the electrical circuit, e.g. the transistor, of the respective semiconductor die and serve for electrically connecting the semiconductor die to the outside. The contact elements may have any desired form or shape. They can, for example, have the form of lands, i.e. flat contact layers on an outer surface of the semiconductor die. The contact elements or contact pads may be made from any electrically conducting material, e.g. from a metal as aluminum, gold, or copper, for example, or a metal alloy, or an electrically conducting organic material, or an electrically conducting semiconductor material. The contact elements may also be formed as layer stacks of one or more of the above-mentioned or further materials so as to create, for example, a stack of NiPdAu.

The examples of an electronic device may comprise an encapsulant or encapsulating material having the semiconductor transistor chips embedded therein. The encapsulating material can be any electrically insulating material like, for example, any kind of molding material, any kind of resin material, or any kind of epoxy material, a bismaleimide, or a cyanate ester. The encapsulating material can also be a polymer material, a polyimide material, a thermoplast material, a ceramic material, and a glass material. The encapsulating material may also comprise any of the above-mentioned materials and further include filler materials embedded therein like, for example, thermally conductive increments. These filler increments can be made of SiO, Al2O3, ZnO, AlN, BN, MgO, Si3N4, or ceramic, or a metallic material like, for example, Cu, Al, Ag, or Mo. Furthermore the filler increments may have the shape of fibers and can be made of carbon fibers or nanotubes, for example.

Insofar as methods for fabricating an electronic device are described as having a specific order of method steps, it should be mentioned that any other appropriate order of the method steps may be employed by the skilled person. It should further be mentioned that any comments, remarks or features mentioned in connection with a described method are to be understood as also disclosing a device being obtained or resulting from such comments, remarks or features, even if such a device is not explicitly described or illustrated in the figures. Furthermore vice versa any comments, remarks or features mentioned in connection with a device are to be understood as also disclosing a method step for providing or fabricating the respective device feature.

The term "soft solder" or "soft solder material" as used throughout the present disclosure can be understood in a sense that a solder material is meant which has a melting temperature lower than 400° C.

FIG. 1 shows a flow diagram for illustrating an exemplary method for fabricating a semiconductor device according to the first aspect. The method placing a first semiconductor chip on a carrier with the first main surface of the first semiconductor chip facing the carrier, wherein a first layer of soft solder material is provided between the first main surface and the carrier and heat is applied during placing so that a temperature at the first layer of soft solder material is equal to or higher than a melting temperature of the first layer of soft solder material (s1), placing a contact clip comprising a first contact area on the first semiconductor chip with the first contact area facing the second main surface of the first semiconductor chip, wherein a second layer of soft solder material is provided between the first contact area and the second main surface and heat is applied during placing so that a temperature at the first layer of soft solder material is equal to or higher than a melting temperature of the first layer of soft solder material (s2) and thereafter cooling the first and second layers of soft solder material to solidify the soft solder materials (s3).

According to an example of the method of the first aspect, the first and second layers of soft solder material do not contain any flux material. The term "flux" may refer to any sort of chemical agent or additive which assists in the soldering process and in the joining process. In particular, the term "flux" may refer to a chemical cleaning agent, a purifying agent, or a flowing agent.

According to an example of the method of the first aspect, after providing the first and second layers of soft solder material, no flux material is added to anyone of the first and second layers of soft solder material.

The aforementioned examples therefore imply that flux material is neither deposited together with the deposition of the first and second layers nor is it added to the first and second layers after the first and second layers of soft solder material have been deposited.

According to an example of the method of the first aspect, one or more of the first and second layers of soft solder material comprise a melting point below 400° C., more particular below 350° C., more particular below 300° C., more particular below 250° C., more particular below 200° C.

According to an example of the method of the first aspect, one or more of the first and second layers of soft solder material is lead-based or lead-free. According to an example thereof, one or more of the first and second layers of soft solder material are comprised of Pb/Sn1/Ag1.5, Pb/Sn2/Ag2.5 or Pb/Sn5.

According to an example of the method of the first aspect, the soft solder material of the first layer is equal to the soft solder material of the second layer.

According to an example of the method of the first aspect, the soft solder material of the first layer is different from the soft solder material of the second layer.

According to an example of the method of the first aspect, the first semiconductor chip is a power semiconductor chip. In the case of semiconductor transistor chips like, for example, insulated gate bipolar transistor (IGBT) chips, the term "power" may imply an emitter collector voltage of the IGBT above 1200 V.

According to an example of the method of the first aspect, the method is used for fabricating a power transistor package, like e.g. a TO263 package, a TO252 package, or a TOLL package.

According to an example of the method of the first aspect, the first contact area of the contact clip and the second main surface of the first semiconductor chip comprise the same metal material. In particular, the second main surface of the first semiconductor chip may comprise a contact pad of the same metal material as of the first contact area of the contact clip.

According to an example of the method of the first aspect, the method further comprises providing a second semiconductor chip having a first main surface and a second main surface opposite to the first main surface, and placing the second semiconductor chip on the contact clip, wherein a third layer of soft solder material is provided between the second semiconductor chip and the contact clip. According to a further example thereof, the soft solder materials of the first, second and third layers are similar or equal to each other or comprise similar or equal properties.

According to a further example thereof, the second semiconductor chip is a power semiconductor chip. In particular, the first and second semiconductor chips may both be comprised of power semiconductor chips connected with each other to form a high power switch circuit like, for example, a half-bridge circuit.

According to an example of the method of the first aspect, the carrier is placed in a chip attaching apparatus, in particular in hermetic index tunnel in which a temperature is generated so that the soft solder materials of the first and second layers are melted. According to a further example thereof, within the hermetic index tunnel an atmosphere is generated which contains hydrogen and nitrogen, in particular hydrogen in a range from 86% to 97%, in particular from 88% to 95%, and nitrogen in a range from 4% to 14%, in particular from 5% to 12%, in order to prevent oxidation on the carrier or solder. The temperature is controlled so that it is equal to or higher than the melting temperatures of the soft solder materials.

According to an example of the method of the first aspect, cooling is performed in a cooling zone within the chip attaching apparatus to solidify the soft solder material under forming gas environment.

Further examples of the method for fabricating a semiconductor device according to the first aspect can be formed by incorporating examples or features which will be described in the following in connection with the further aspects and examples of the disclosure.

Figure 2:
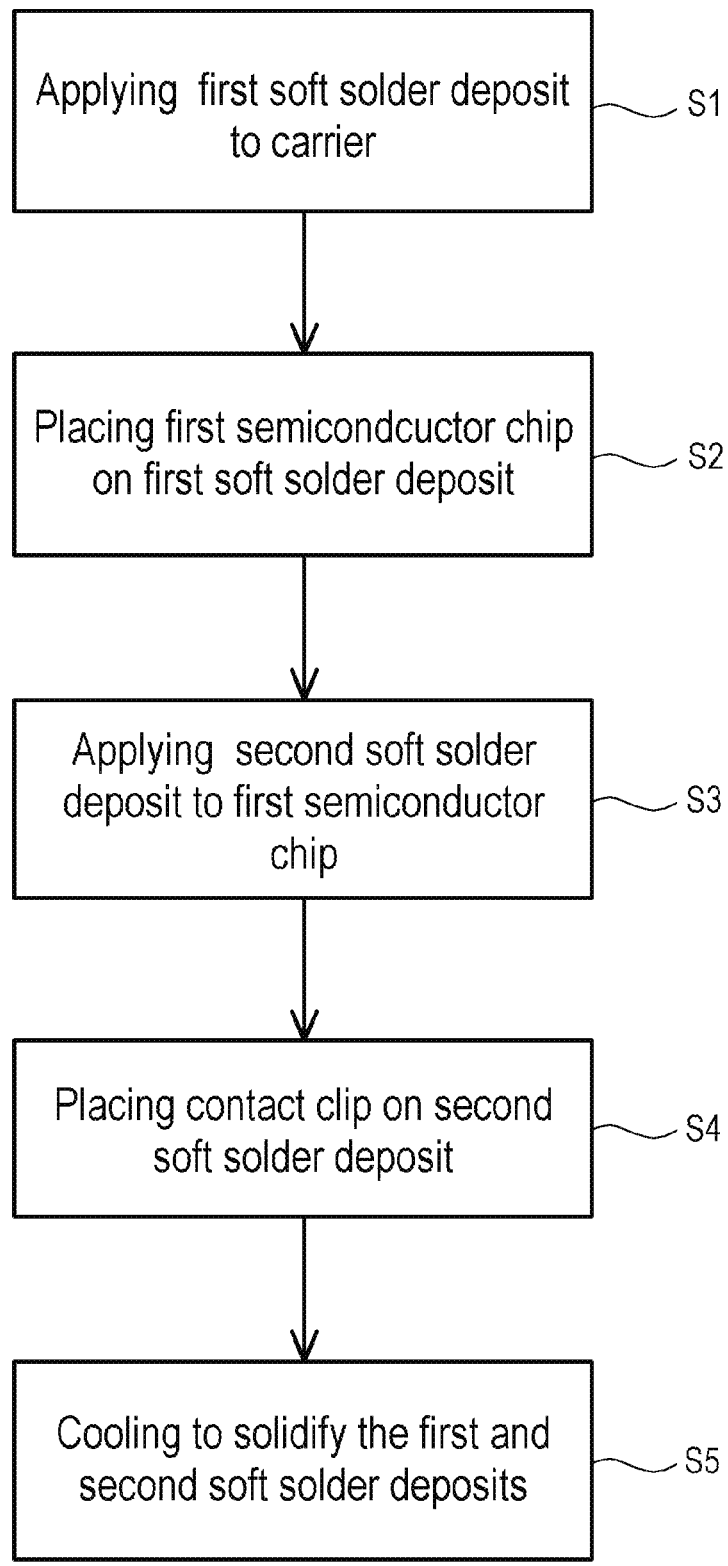
FIG. 2 shows a flow diagram for illustrating an exemplary method for fabricating a semiconductor device according to a second aspect.

FIG. 2 shows a flow diagram for illustrating an exemplary method for fabricating a semiconductor device according to a second aspect. The method comprises applying a first flux-free soft solder deposit to a carrier at a temperature equal to or greater than a melting temperature of the first flux-free soft solder deposit (s1), placing a first semiconductor chip on the first flux-free soft solder deposit (s2), applying a second flux-fee soft solder deposit to the first semiconductor chip at a temperature equal to or greater than a melting temperature of the second flux-free soft solder deposit (s3), placing a contact clip on the second flux-free soft solder deposit (s4) and thereafter cooling the first and second soft solder deposits to solidify the first and second soft solder deposits (s5).

According to an example of the method of the second aspect, after applying the first and second flux-free soft solder deposits, no flux material is added to anyone of the first and second layers of soft solder deposits.

According to an example of the method of the second aspect, the method further comprises applying a third flux-free soft solder deposit to the contact clip, and placing a second semiconductor chip on the third flux-free soft solder deposit. According to a further example thereof, heat is applied during applying and placing so that a temperature is equal to or greater than a melting temperature of the third flux-free soft solder deposit. According to a further example thereof, after applying the third soft solder deposit, no flux material is added to the third soft solder deposit.

According to an example of the method of the second aspect, a maximum temperature applied is below 400° C., more particular below 350° C., more particular below 300° C., more particular below 250° C., more particular below 200° C. The maximum temperature applied depends on the melting temperature of the first, second and, if any, third soft solder deposits or, in case of different soft solder materials, the highest melting temperature of the first, second and, if any, third soft solder deposit.

Further examples of the method for fabricating a semiconductor device according to the second aspect can be formed by incorporating examples of features which were described above in connection with the method according to the first aspect.

Figure 3A:
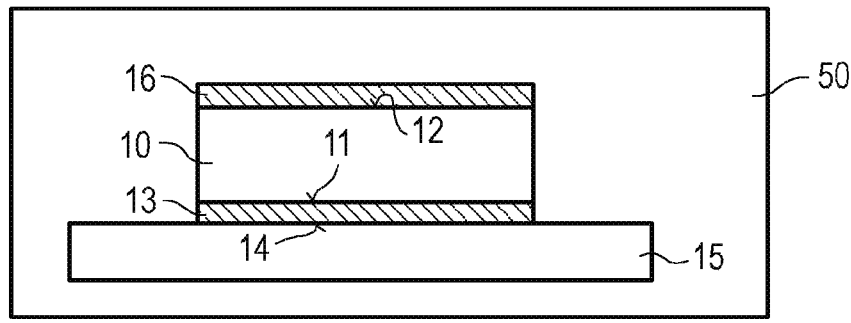
FIG. 3 comprises FIG. 3A-3C and shows schematic cross-sectional side view representations for illustrating an exemplary method for fabricating a semiconductor device comprising a semiconductor chip and a contact clip.
Figure 3B:
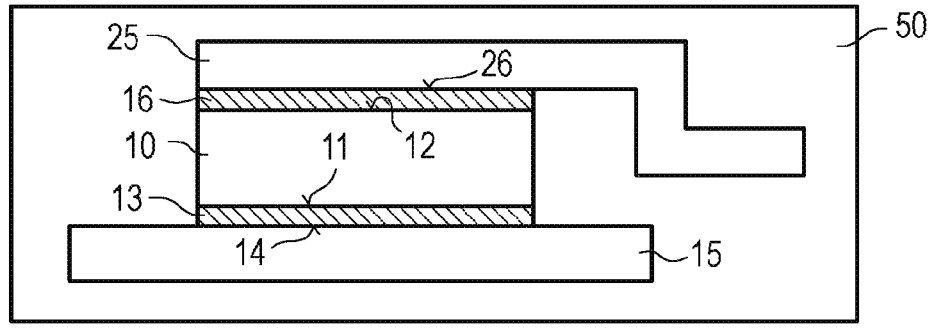
Figure 3C:
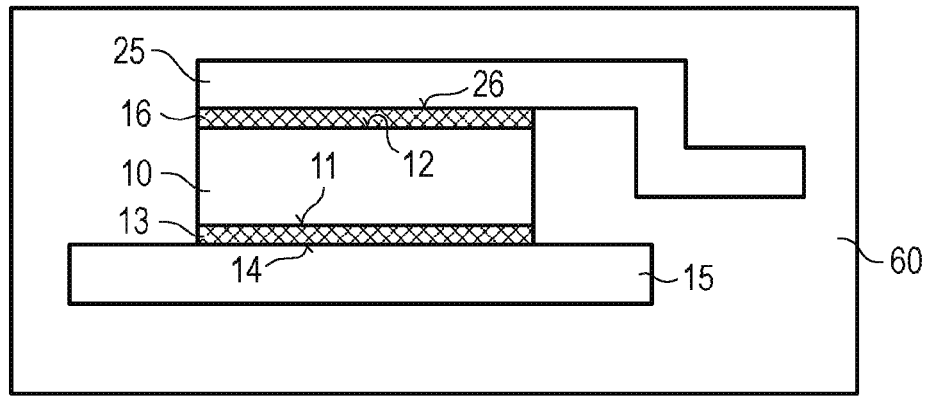

FIG. 3 comprises FIG. 3A-3C and schematically illustrates a method for fabricating a semiconductor device. FIG. 3A schematically illustrates a carrier 15, the carrier 15 may, e.g. be a chip pad of a leadframe, a PCB (printed circuit board), a DCB (direct copper bond), which is a ceramic substrate with copper layers on its top and bottom surfaces, etc. The carrier 15 is made of or has an upper surface 14 made of any desired metal capable of forming a diffusion solder bond, for example, Cu, Ni, NiSn, Au, Ag, Pt, Pd, or an alloy of one or more of these metals.

In FIG. 3A a carrier is placed in a hermetic indexer tunnel 50 of a chip attaching apparatus and a first layer of soft solder material 13 is deposited on the upper surface 14 of the carrier 15. The first layer of the soft solder material 13 may be made of any of the soft solder materials mentioned above or may have any of the properties of soft solder materials mentioned above.

According to an example, the first layer 13 of soft solder material is deposited by using a sputtering process. In this case, the deposition rate is set to such a value that a desired amount or layer thickness of deposited soft solder material is obtained.

According to one example, the first layer 13 of soft solder material may be deposited by an electro-chemical deposition process. For that purpose a solution containing solder particles is applied to the carrier 15, and an appropriate voltage is applied between the carrier 15 and a reference electrode such that the solder particles deposit on the upper surface of the carrier 15.

According to one example, the first layer 13 of soft solder material may be deposited by printing or dispensing a soft solder material paste on the upper surface 14 of the carrier 15. The soft solder material paste may contain metal particles as mentioned above. It may be free of any organic solvent known in the art to be used to separate the metal particles.

FIG. 3A also schematically illustrates a semiconductor chip 10 that is placed on the carrier 15 with a first main surface 11 of the semiconductor chip 10 facing the carrier 15 and a second main surface 12 facing away from the carrier 15. The first layer 13 of soft solder material is arranged between the first main surface 11 of the semiconductor chip 10 and the upper surface 14 of the carrier 15. A first chip electrode (not shown) may be arranged at the first main surface 11 of the semiconductor chip 10 opposite to and in abutment with the first layer 13 of soft solder material. The first semiconductor chip 10 can be, for example, a power semiconductor chip.

In FIG. 3A a second layer 16 of soft solder material is deposited on the second main surface 12 of the semiconductor chip 10. A second chip electrode (not shown) may extend at the second main surface 12 of the semiconductor chip 10, and the second layer 16 of soft solder material may be placed on this second chip electrode.

In FIG. 3B a contact clip 25 is placed over the semiconductor chip 10. The contact clip 25 may have a first contact area 26. The contact clip 25 is placed such that the first contact area 26 is placed over the second layer 16 of soft solder material. The contact clip 25 or, at least, the first contact area 26 of the contact clip 25 may be made of any desired metal capable of forming a diffusion solder bond, for example, Cu, Ni, NiSn, Au, Ag, Pt, Pd, or any alloy of one or more of these metals.

The contact clip 25 may be a lead connecting or forming an external terminal of the semiconductor device to be fabricated. By way of example, the contact clip 25 may be a lead of a leadframe and the carrier 15 may be a chip pad of the leadframe. As will be described in more detail further below, in other embodiments the contact clip 25 may be a conducting element bridging between the second chip electrode and an external terminal (such as, e.g., a lead of a leadframe) of the semiconductor device.

In FIG. 3C the arrangement shown in FIG. 3B is introduced into a cooling zone 60. In the cooling zone 60 the soft solder materials of the first layer 13 and of the second layer 16 are brought to a lower temperature in order to solidify the soft solder materials and thereby to attach the semiconductor chip 10 to the carrier 15 and to attach the contact clip 25 to the semiconductor chip 10.

Figure 4A:
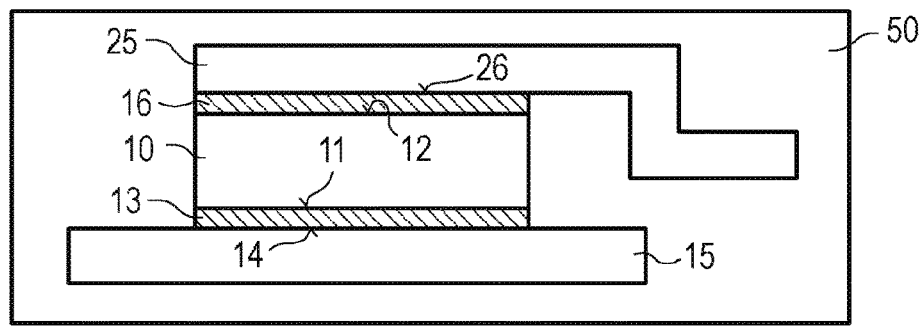
FIG. 4 comprises FIG. 4A-4C and shows schematic cross-sectional side view representations for illustrating an exemplary method for fabricating a semiconductor device comprising a first semiconductor chip, a contact clip, and a second semiconductor chip.
Figure 4B:
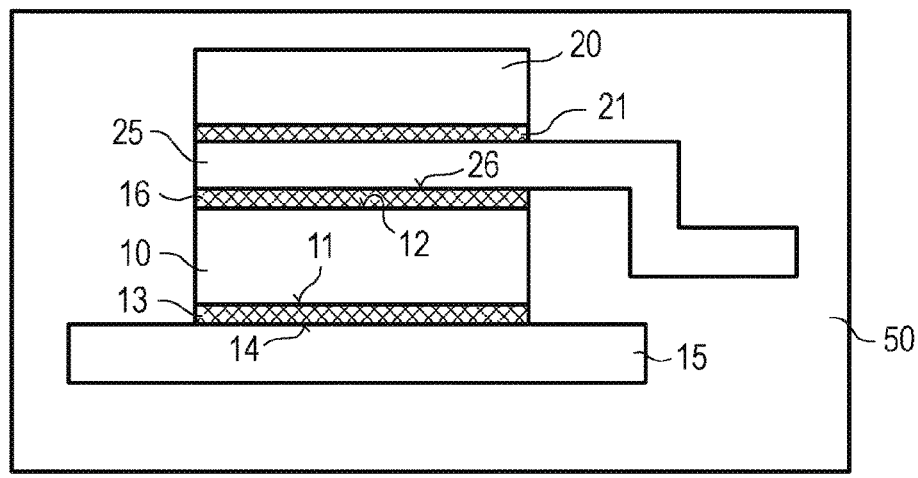
Figure 4C:
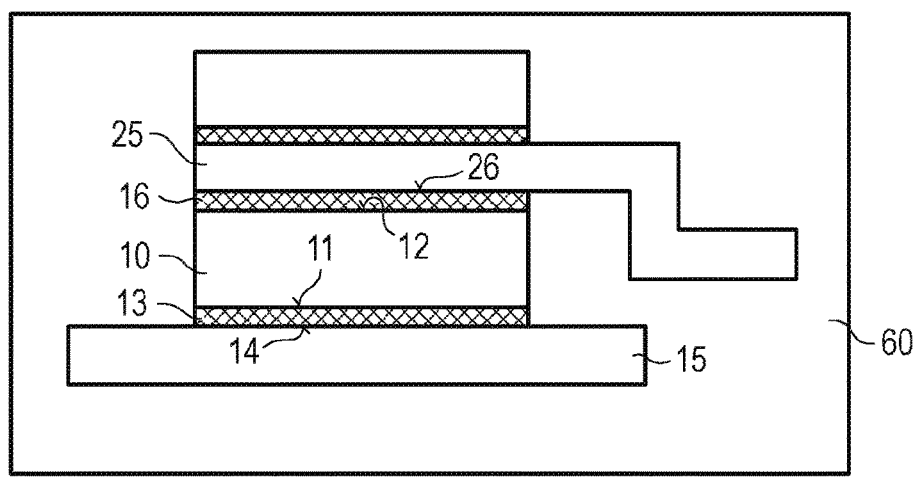

FIG. 4 comprises FIG. 4A-4C wherein a second semiconductor chip 20 is applied to the contact clip 25.

FIG. 4A shows again the configuration identical to FIG. 3B which was shown and explained above. FIG. 4B shows that a third layer 21 of soft solder material has been deposited on an upper surface of the contact clip 25. In particular, the soft solder material of the third layer 21 may be deposited on the contact clip 25 by the same techniques as described above and the soft solder material may be the same as that used for the first and second layers 13 and 16 of soft solder material.

In FIG. 4B furthermore a second semiconductor chip 20 is applied to the third layer 21 of soft solder material. The second semiconductor chip 20 can, for example, also be a power semiconductor chip.

In FIG. 4C the arrangement shown in FIG. 4B is introduced into the cooling zone 60. The first, second and third layers 13, 16 and 21 of soft solder material are processed in the same way as described above with reference to FIG. 3A to 3C in order to attach the semiconductor chip 10 to the carrier 15, to attach the contact clip 25 to the semiconductor chip 10, and to attach the second semiconductor chip 20 to the contact clip 25.

Figure 5A:
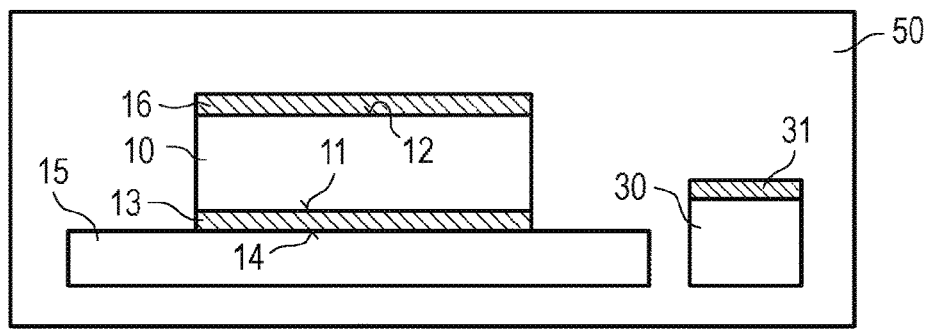
FIG. 5 comprises FIG. 5A-5C and shows schematic cross-sectional side view representations for illustrating an exemplary method for fabricating a semiconductor device comprising a first semiconductor chip, a second semiconductor chip, a contact clip, and a contact element connected with the contact clip.
Figure 5B:
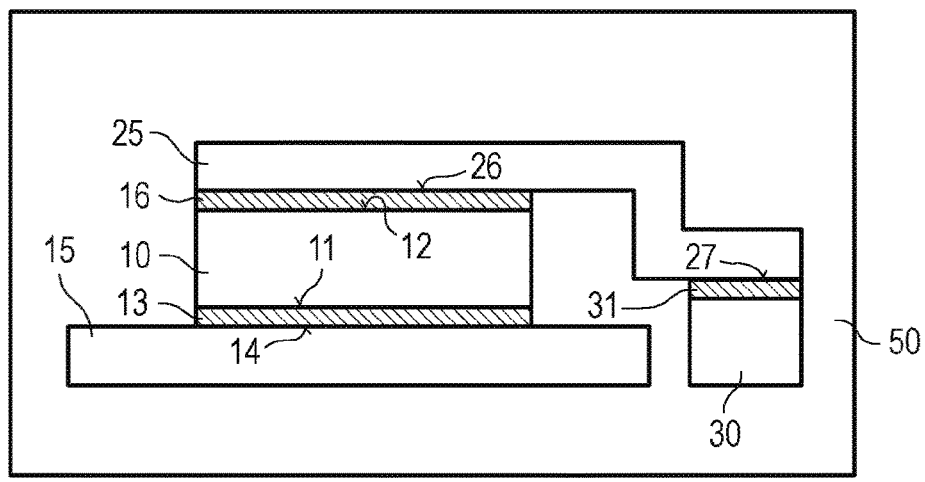
Figure 5C:
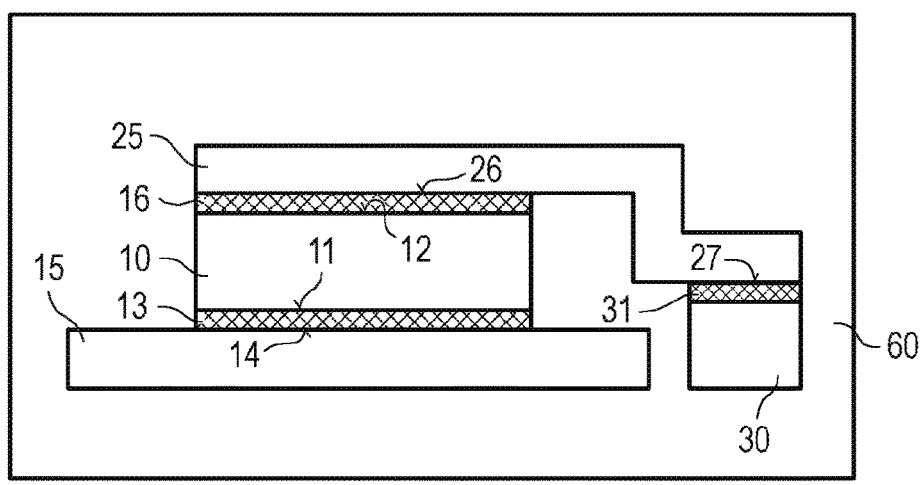

FIG. 5 comprises FIG. 5A-5C and shows in addition to FIG. 3 the connection of the contact clip 25 to a lead 30. In FIG. 5A a lead 30 is provided. The lead 30 may be a lead of a leadframe wherein, in this case, the carrier 15 may be a chip pad of the leadframe. A third layer 31 of soft solder material has been deposited on an upper surface of the lead 30. All disclosures relating to the first and second layers 13 and 16 of soft solder material similarly apply to the third layer 31 of soft solder material. In particular, the soft solder material of the third layer 31 of soft solder material may be deposited on the lead 30 by the same techniques as described above, and the soft solder material may be the same as that used for the first and second layers 13 and 16.

In FIG. 5B the contact clip 25 is placed on the semiconductor chip 10 and the lead 30. The contact clip 25 has a second contact area 27 opposite to and in abutment with the third layer 31 of soft solder material. The second contact area 27 may be comprised of the same material as mentioned above in relation to the first contact area 26.

In FIG. 5C the arrangement shown in FIG. 5B is introduced into the cooling zone 60. The first, second and third layers 13, 16 and 31 of soft solder material are processed in the same way as described above with reference to FIGS. 3A to 3C and 4A to 4C in order to attach the semiconductor chip 10 to the carrier 15, to attach the contact clip 25 to the semiconductor chip 10, and to attach the contact clip 25 to the lead 30.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

What is claimed is:

1. A method, comprising:
   placing a carrier in a hermetic index tunnel;
   placing a first semiconductor chip on the carrier with a first main surface of the first semiconductor chip facing the carrier, wherein a first layer of soft solder material is provided between the first main surface and the carrier and heat is generated within the hermetic index tunnel during placing so that a temperature at the first layer of soft solder material is equal to or higher than a melting temperature of the first layer of soft solder material;
   placing a contact clip comprising a first contact area on the first semiconductor chip with the first contact area facing a second main surface of the first semiconductor chip, wherein a second layer of soft solder material is provided between the first contact area and the second main surface and heat is generated within the hermetic index tunnel during placing so that a temperature at the second layer of soft solder material is equal to or higher than a melting temperature of the second layer of soft solder material; and thereafter
   cooling the first and second layers of soft solder material to solidify the soft solder materials.

2. The method according to claim 1, wherein the first and second layers of soft solder material do not contain any flux material.

3. The method according to claim 1, wherein after providing the first and second layers of soft solder material, no flux material is added to anyone of the first and second layers of soft solder material.

4. The method according to claim 1, wherein one or more of the first and second layers of soft solder material comprise a melting point below 400° C., more particular below 350° C., more particular below 300° C., more particular below 250° C., more particular below 200° C.

5. The method according to claim 1, wherein one or more of the first and second layers of soft solder material is lead-based.

6. The method according to claim 5, wherein one or more of the first and second layers of soft solder material are comprised of Pb/Sn1/Ag1.5, Pb/Sn2/Ag2.5 or Pb/Sn5.

7. The method according to claim 1, wherein the soft solder material of the first layer is equal to the soft solder material of the second layer.

8. The method according to claim 1, wherein the soft solder material of the first layer is different from the soft solder material of the second layer.

9. The method according to claim 1, wherein the first semiconductor chip is a power semiconductor chip.

10. The method according to claim 1, wherein the first contact area of the contact clip and the second main surface of the first semiconductor chip comprise the same metal material.

11. The method according to claim 1, further comprising:
    providing a second semiconductor chip having a first main surface and a second main surface opposite to the first main surface; and
    placing the second semiconductor chip on the contact clip, wherein a third layer of soft solder material is provided between the second semiconductor chip and the contact clip.

12. The method according to claim 11, wherein the soft solder material of the third layer is equal to or comprises similar or equal properties of the soft solder material of the first and second layers.

13. The method according to claim 11, wherein the second semiconductor chip is a power semiconductor chip.

14. The method according to claim 1, wherein cooling the first and second layers of soft solder material comprises cooling the first layer of soft solder material before cooling the second layer of soft solder material.

15. A method, comprising:
    placing a carrier in a hermetic index tunnel;
    applying a first flux-free soft solder deposit to the carrier in the hermetic index tunnel at a temperature equal to or greater than a melting temperature of the first flux-free soft solder deposit;
    placing a first semiconductor chip on the first flux-free soft solder deposit;
    applying a second flux-fee soft solder deposit to the first semiconductor chip in the hermetic index tunnel at a temperature equal to or greater than a melting temperature of the second flux-free soft solder deposit;
    placing a contact clip on the second flux-free soft solder deposit; and thereafter
    cooling the first and second soft solder deposits to solidify the first and second soft solder deposits.

16. The method according to claim 15, further comprising:
    applying a third flux-free soft solder deposit to the contact clip at a temperature equal to or greater than a melting temperature of the third flux-free soft solder deposit; and
    placing a second semiconductor chip on the third flux-free soft solder deposit.

17. The method according to claim 15, wherein applying heat comprises placing the carrier, the semiconductor chip and the contact clip in a furnace, wherein a maximum temperature applied by the furnace is below 400° C., more particular below 350° C., more particular below 300° C., more particular below 250° C., more particular below 200° C.

18. The method according to claim 15, wherein cooling the first and second soft solder deposits comprises cooling the first soft solder deposit before cooling the second soft solder deposit.

* * * * *